US011309473B2

(12) United States Patent
Carr

(10) Patent No.: US 11,309,473 B2
(45) Date of Patent: Apr. 19, 2022

(54) LIGHT EMITTING PLATFORM (LEP) WITH PHONONIC STRUCTURED NANOWIRES

(71) Applicant: William N. Carr, Gainesville, FL (US)

(72) Inventor: William N. Carr, Gainesville, FL (US)

( * ) Notice: Subject to any disclaimer, the term of this patent is extended or adjusted under 35 U.S.C. 154(b) by 0 days.

(21) Appl. No.: 17/521,104

(22) Filed: Nov. 8, 2021

(65) Prior Publication Data
US 2022/0059745 A1   Feb. 24, 2022

Related U.S. Application Data

(63) Continuation-in-part of application No. 17/353,421, filed on Jun. 21, 2021, and a continuation-in-part of application No. 16/501,641, filed on May 16, 2019, and a continuation-in-part of application No. 16/221,500, filed on Dec. 15, 2018, now abandoned, and a continuation-in-part of application No. 15/805,698, filed on Nov. 7, 2017, now Pat. No. 10,008,373, and a continuation-in-part of application No. 15/727,249, filed on Oct. 6, 2017, now abandoned, and a continuation-in-part of application No. 15/632,462, filed on Jun. 26, 2017, now abandoned, and a continuation-in-part of application No. 15/626,151, filed on Jun. 18, 2017, now Pat. No. 9,817,130.

(60) Provisional application No. 62/742,405, filed on Oct. 7, 2018, provisional application No. 62/493,147, filed on Jun. 24, 2016.

(51) Int. Cl.
*G01J 5/00* (2006.01)
*H01L 33/64* (2010.01)
*H01L 27/15* (2006.01)
*H01L 33/06* (2010.01)

(52) U.S. Cl.
CPC .......... *H01L 33/645* (2013.01); *H01L 27/156* (2013.01); *H01L 33/06* (2013.01)

(58) Field of Classification Search
CPC ...... H01L 33/645; H01L 27/156; H01L 33/06
See application file for complete search history.

(56) References Cited

PUBLICATIONS

O'Regan et al., "Silicon photonic crystal thermal emitter at near-infrared wavelengths", Scientific Reports, vol. 5, No. 13415, pp. 1-8, DOI:10.1038/srep13415. (Year: 2015).*

* cited by examiner

*Primary Examiner* — Kiho Kim
(74) *Attorney, Agent, or Firm* — Kaplan Breyer Schwarz, LLP

(57) ABSTRACT

A semiconductor-based light emitting platform (LEP) comprising a heated blackbody radiator wherein the light emitting platform is thermally isolated by nanowires having ultra-low thermal conductivity. In embodiments, the pixel is structured for broadband emission with a platform comprising an infrared surface structured for high emissivity within a broadband wavelength range. In other embodiments radiation is confined to a limited bandwidth by metamaterial and other resonant filters. In embodiments, the internal efficiency of the LEP configured for broadband operation can be higher compared with an LED.

21 Claims, 17 Drawing Sheets

LIGHT EMITTING PLATFORM (LEP) WITH PHONONIC STRUCTURED NANOWIRES

STATEMENT OF RELATED CASES

This case is a continuation-in-part of U.S. patent application Ser. No. 17/353,421 filed on Jun. 21, 2021, U.S. patent application Ser. No. 16/501,641 filed May 16, 2019, and U.S. patent application Ser. No. 16/221,500 filed Dec. 15, 2018. These applications are incorporated herein by reference. If there are any contradictions or inconsistencies in language between the present specification, and the aforementioned applications that are incorporated by reference that might affect the interpretation of the claims in this case, the claims in this case should be interpreted to be consistent with the language in this case.

FIELD OF THE INVENTION

The present invention pertains to an apparatus comprising a nanostructured pixel for sourcing photonic electromagnetic radiation.

BACKGROUND OF THE INVENTION

The first electrically-powered photonic emitter manufactured in significant quantities was the incandescent electric light patented by Edison in U.S. Pat. No. 223,898 issued 1880. The more efficient semiconductor LED photo source patented by Biard and Pittman, U.S. Pat. No. 3,293,513 issued in 1966 provided another significant innovation in the history of photonic emitters based on a forward biased pn junction providing NIR emission within a limited bandwidth. An incandescent emitter fabricated at microscale on a silicon substrate is disclosed in Blomberg et al in U.S. Pat. No. 5,644,676.

Existing prior art for photonic emitters based on heated metamaterial structure are disclosed in the following. The references listed include both blackbody emitters and absorbers, drawing on Kirchhoff's Law of Photonics which states "a surface in thermal equilibrium with surroundings has thermal emissivity equal to its thermal absorptivity".

H. Wang et al, "*Titanium-nitride-based integrated plasmonic absorber/emitter for solar thermophotovoltaic application*", Photon. Res, vol. 3, pp. 329-334 (2015) disclose a plasmonic metamaterial emitter with an ALO surface area film over a AlN/TiN sandwich having 90% absorptivity for visible light wavelengths.

H. Wang et al, "*Switchable wavelength-selective and diffuse metamaterial absorber/emitter with a VO2 phase transition spacer layer*", App. Phys. Lett., vol. 105, 071907 (2014), disclose a metamaterial infrared absorber/emitter structured as a tri-level sandwich comprising a Bragg resonant first layer overlaying an intermediate layer of VO2 having an underlying reflecting metal film. When heated, the VO2 becomes metallic and the absorbance spectral peak vanishes providing a means for switching or tuning.

A Ghanekar et al, "*Novel and efficient Mie-metamaterial thermal emitter for thermophotovoltaic systems*," Optics Express vol. 24, pp A868-A877 (2016) disclose a metamaterial thermal emitter comprised of randomly-disposed tungsten particles within an SiO2 film matrix over a reflecting tungsten film. The Mie resonance of the nanoparticles provides a non-plasmonic emitter for visible and near infrared light wavelengths.

M. Shaban et al "*Tunability and sensing properties of plasmonic/1D photonic crystal*", Scientific Reports, vol. 7, 41983 (2017) disclose a photonic crystal (PhC) absorber comprised of random metal grains over a sandwich of stacked $SiO_2$/SiN films. The surface grains provide a plasmonic resonance at the edge of the photonic band-gap (PBG). When heated, the thermal emission is in the visible for this proto absorber design.

X. Liu, X et al, "*Experimental realization of a terahertz all-dielectric metasurface absorber*" Optics Express, vol. 25, 281296 (2017), disclose a nonplasmonic terahertz absorber with 97.5% efficiency at a frequency of 1 THz and with a Q=14. The metasurface structure is comprised of a first layer of patterned Si disks disposed over an unpatterned SiO2 film.

W. Zhu, W et al disclose a "Tunneling-enabled spectrally selective thermal emitter based on flat metallic films", Appl. Phys. Lett., vol. 106, 10114 (2015) wherein a metamaterial thermal emitter is tuned for maximum emissivity at 10 um wavelength. The plasmonic surface resonance is excited with photonic tunneling of the evanescent wave from a Fabry-Perot cavity.

S. Luk et al, in U.S. Pat. No. 9,799,798 disclose a metamaterial infrared light source comprised of a quantum well, multi-layer stack. This thermal emitter is comprised of a semiconductor metamaterial having alternating layers of doped semiconductor material and undoped semiconductor material configured to form a plurality of quantum wells. When heated, the metamaterial radiates at a wavelength wherein the effective permittivity is near zero.

Ali et al in U.S. Pat. No. 9,214,604 disclose a metamaterial infrared light source comprised of a dielectric membrane with laterally spaced metal plasmonic structures.

Araci, et al, in U.S. Pat. No. 8,492,737 disclose a metamaterial infrared light source comprised of a plasmonic stacked metal-dielectric-metal structure of Wand HfO2 layers.

W. Li et al in "*Photonic thermal management of colored objects*", Nature Comm, vol. 9, 4240 (October 2018) disclose a colored thin film surface having an emissivity of 99.7 $Wm^{-2}$ at 298K providing selective emissivity over a spectral range.

SUMMARY OF THE INVENTION

The present invention discloses an apparatus comprising a pixel having a microplatform thermally isolated by phononic structured semiconductor nanowires and suspended from a surrounding substrate. Electromagnetic radiation from the microplatform is obtained by resistive heating, driven by blackbody radiation from the microplatform surface. The microplatform is comprised of a thermal element heating the microplatform. In embodiments, photonic element types are disclosed for enhancing microplatform emissivity over broadband wavelength range. In other embodiments, the metamaterial (MM) selected RC resonant filters reduce the emitted radiation to a limited wavelength range. In embodiments, the pixel provides an emitter for electromagnetic radiation over a broadband spectrum extending from ultraviolet (UV) to millimeter wavelength radiation.

In embodiments, the photonic structure comprises a metamaterial (MM) and/or photonic crystal (PhC) structure providing a filter for the blackbody sourced radiation from the heated microplatform. In embodiments, the photonic structure comprises a broadband emitter comprised of vertical wall carbon nanotubes or lithographically patterned pillars which provide almost perfect emissivity over a wide wavelength range. In other embodiments, the photonic structure comprises a plasmonic resonant filter.

The microplatform is thermally isolated from a surrounding support platform by phononic nanostructured semiconductor nanowires, the nanowires structured to achieve ultra low thermal conductivity. The temperature of the microplatform is controlled by one or more resistive thermal elements powered from an external voltage or current source. In some embodiments, the resistive heater element is operated as a thermistor providing measurement of microplatform temperature.

In some embodiments, the apparatus of this invention includes a light emitting platform (LEP) comprising:
1. A light emitting microplatform (LEP) comprising:
   a first substrate having a cavity;
      a plurality of nanowires, wherein the nanowires are physically coupled to a platform and the first substrate, the nanowires thereby suspending the microplatform in the cavity; wherein:
         (a) the platform comprises a photonic element and a thermal element;
         (b) the photonic element comprises a material or device of high emissivity for light within a wavelength range;
         (c) the thermal element comprises an electric resistive element for heating the microplatform;
         (d) at least one of the nanowires comprises a phononic element;
         (e) the phononic element includes a crystalline semiconductor first layer comprising structure that reduces a thermal conductivity of the first layer;
         (f) the phononic element increases a ratio of electrical conductivity to thermal conductivity of the nanowire; and
         (g) the LEP is physically configured for application as a photonic thermal emitter.

In some embodiments, the LEP comprises a plurality of thermal platforms, disposed in a 1- or 2-dimensional array. Individual LEP platforms are of plan dimension ranging from 10 micrometers to 1 millimeter. An individual LEP platform within an array provides a radiated power within the range of 1 nanowatt to 100 milliWatt. An array of LEPs may comprise an entire wafer and provide a radiated power of over 100 Watts. An LEP array in embodiments may comprise addressing circuitry for enabling individual microplatform emitters.

In some embodiments, the heated microplatform is comprised of one or more temperature sensors including a thermistor or a Seebeck thermoelectric sensor are connected to provide a sensor for microplatform temperature. In some embodiments, the resistive heater itself provides the thermistor for monitoring microplatform temperature.

The thermal microplatform comprises one or more layers-of lateral and/or stacked elements. In embodiments, the emitter is an LC resonator or micro-antenna.

In other embodiments the photonic structure comprises resonant metamaterial (MM) in the form of split ring resonators structured with a deep sub-wavelength geometry. The metamaterial may comprise nanostructured flakes imbedded within a dielectric matrix. MM may be disposed in a single level or separated by dielectric layers into multiple layers over a conducting ground plane.

In some embodiments, MM is configured to increase surface plasmonic polaritons (SPP) providing resonance. SPPs are a type of bosonic quasiparticle having both wave-like and particle qualities and SPP resonance is obtained by patterned metallic film structures in the microplatform surface. In this invention, SPPs within the metamaterial are excited by the blackbody surface electromagnetic field. In some embodiments, SPPs comprise electric dipole and magnetic dipole modes with sub-wavelength surface arrayed structures overlapping in frequency. SPPs may comprise resonant structures with single and multiple tightly coupled ring resonators. Here SPPs are created in and around metallic structures. In this invention, the SPP is a sub-wavelength patterned structure wherein the electromagnetic emission or absorption originates from oscillating electrons in a highly conducting metal. In embodiments, the plasmonic MM is designed to provide a specific resonant response defining the emission wavelength band. In embodiments, the MM is structured to provide radiation within one or more wavelength bands.

In embodiments, the photonic structure comprises resonant elements providing a polarization of the emitted radiation. In embodiments, the MM comprises Fano and Mie resonators to provide a narrow bandwidth resonance with accompanying high-Q emissivity In embodiments, patterned resonant structure comprises one or more of metallic, dielectric or semiconductor layers shaped variously as one or more of squares, crossbars, circles, resonant antennas in the form of structured layers, pits, dots and cavities. In embodiments, these structures are specifically structured to provide an electromagnetic resonance within a limited wavelength range further enhancing emissivity.

In some embodiments, the metamaterial resonant structure is covered with a broadband surface material such as vertical wall carbon nanotubes to increase emissivity within the wavelength range of the resonant MM.

In embodiments, the MM structure is comprised of a material with thermal sensitivity such as vanadium oxide which undergoes a phase change from dielectric to metallic when heated to a specific temperature.

Nanowire structuring and performance is very important in this invention because the internal operational efficiency of the LEP can be increased to near 100%, based on nanowires having ultra low thermal conductivity. In embodiments having maximum radiation efficiency, the cavity containing the microplatform and nanowires is hermetically sealed and maintained in a vacuum or filled with a gas of low thermal conductivity to reduce parasitic cooling through the air. In accordance with the present teachings of this disclosure, a plurality of nanowires is physically configured with one or more first layers comprising phononic scattering and/or phononic resonant structures, physically configured to reduce thermal conductivity.

The effectiveness of phononic structuring of the nanowires is based on the duality principle in quantum mechanics which stipulates that a heat transporting phonon can exhibit both wave- and particle-like properties at nanoscale. Nanoscale structuring of the nanowires can reduce the thermal conduction of individual nanowires to less than 1 Watt/mK in embodiments of this invention. In embodiments, the phononic structures that reduce thermal transport in the nanowire may be disposed in both random and periodic configurations. These structures reduce heat transport through the phononic-structured nanowire by reducing the mean free path for phonon or dissipating phonons via structuring to enhance local resonances. In some modeling of nanowires with periodic nanostructure, the reduction of phononic heat transport is explained by a phononic bandgap which restricts flow of phonons within an energy range In embodiments of this invention, the mechanisms effecting phonon mean free path in the semiconductor nanowires are controlled by structuring of the nanowires. This structuring increases scattering of heat transporting phonons with both resonant structure and non-resonant structures scaled to limit the transport of phonons.

In some embodiments, the phononic structures are created using deep submicron lithography and comprise holes, vias, surface pillars, surface dots, plugs, nanocavities, local particulates, implanted molecular species including molecular aggregates disposed randomly or in periodic fashion. Phononic structuring may be accomplished with e-beam implantation of heavy atoms, or creating local particulates of alloys such as SiGe separated by a few nanometers.

In some embodiments, phononic structuring of nanowires is accomplished using a metal-assisted chemical etching to create porous silicon Y. Shao et al, "Ultralow thermal conductivity of single-crystalline porous silicon nanowires", [Adv. Functional Materials, vol. 27, 1702824 (2017)]. Phonons moving in the crystalline part of the nanowire are scattered at the surface of the pores.

In embodiments, the phononic structure comprises phononic crystal (PnC) created as a periodic array of holes or pillars in the nanowire using deep submicron lithography. Thin films of semiconductor may be physically patterned with decorations to create a phononic crystal (PnC) having a phononic bandgap (see for example, S. Mohammadi et all, *Appl Phys. Lett.*, vol. 92, 221905 (2008). Phononic crystal (PnC) bandgaps define phonon transport frequency bands where the propagation of heat-conducting phonons is forbidden. Phonon scattering within a PnC-structured nanowire is obtained by physically configuring the nanowire to reduce the phononic Brillouin zone and in some embodiments extend scattering to include successive PnC arrayed layers or interfaces. Nanowires configured with PnC structures can enhance both incoherent and coherent scattering of heat conducting phonons. PnC structures can provide a Bragg and/or Mie resonance providing increased scattering of heat conducting phonons to reduce thermal conductivity. A nanowire configured with phononic structure such as a PnC is considered to be a metamaterial nanowire.

Scattering structures disposed in a periodic array format generally provide an increased reduction in thermal conductivity compared with randomly disposed structures.

In some embodiments, Bragg resonant phononic-structure can be created within the first layer of a phononic nanowire by implanting elements such as Ar and Ge using a metal lithographic mask. Mie resonant structures comprise holes, indentations and cavities within a first nanowire layer. (see M. Ziaci-Moayyed, et al "Phononic Crystal Cavities for Micromechanical Resonators", Proc. IEEE 24th Intl Conf. on MEMS, pp. 1377-1381 (2011).

In the present invention, phononic scattering and/or resonant structures reduce thermal energy transport by phonons wherein the bulk electrical resistivity of the nanowire is maintained. The dimensions of phononic scattering structures in this invention are configured to the longitudinal scattering range for electrons, bulk electrical conductivity of the nanowire is maintained.

In embodiments, it is desirable to minimize electron scattering and maximize phonon scattering/resonances in the plurality of nanowires. In a semiconductor nanowire of the present invention, the mean free path for thermal phonon transport ranges from less than 10 nm to over 1000 nm for nanowires without phononic structure. In contrast, the mean free path for electron transport ranges from 1 nm up to 10 nm, much less than for phonons. Phononic structure scattering sites are separated by much more than 1 to 10 nm. As a result, the ratio of thermal to electrical conductivity within the nanowire crystalline first layer is advantageously enhanced with phononic structuring.

In embodiments, the desired phononic scattering and/or resonant structures within nanowires may be created as one or more of randomly disposed and/or periodic arrays of holes, pillars, plugs, cavities, surface structures including quantum dots, implanted elemental species, and embedded particulates. This structuring, in embodiments, comprises a first layer of nanowires reducing the thermal conductivity.

In some embodiments, the first layer comprises a semiconductor film deposition and subsequent annealing to provide a porous or particulate-structured film, created using an electrochemical or multisource evaporation process. In other embodiments, a nanowire is selectively ion implanted with an atomic species, typically a heavy molecule such as Ar to provide phonon-scattering structure. Processes for the synthesis of thin films of nanometer thickness with porous, particulate structures, and implanted species is well known to those familiar with the art.

In embodiments, the phononic structures are formed into the patterned active layer of a silicon SOI starting wafer. In embodiments, the first layer is crystalline semiconductor selected from a group including silicon, germanium, silicon-germanium, gallium nitride, indium phosphide, silicon carbide, and oxides of various metals including bismuth, titanium, and zinc. In embodiments, wherein an increased thermoelectric efficiency for a thermoelectric element is desired, the first layer may be a semiconductor selected from a group including Bi2Te3, BiSe3, CoSb3, Sb2Te3, La3Te4, SnSe, ZnS, CdS and alloys/superlattice combinations thereof.

In some embodiments, the nanowire comprised of a first layer is configured as a sandwich structure comprising a second layer. The second layer is an ALD metal of nanometer thickness selected from a group including Pt, W, Pd, Cu, Ti, NiCr, Mo and Al providing an increased electrical conductivity for the nanowire. The second layer may be deposited as a film over the entire length of the nanowire. In embodiments, the second layer of metal connects further onto a thermal heating element disposed on the microplatform. The ALD metal is generally of thickness ranging from 2 to 15 nanometers.

In embodiments, the nanowire comprised of a first layer is configured with a third layer wherein the third layer is dielectric material selected from one or more of silicon nitride, silicon oxynitride, aluminum oxide, silicon dioxide and metal oxides to provide electrical isolation and/or a reduction in mechanical stress. The third layer may extend beyond the nanowire and over the microplatform providing a biaxial compensating stress to reduce overall film stress. In embodiments, the third layer of dielectric material may be disposed between the first and a second layer. The third layer may be disposed onto a second layer. In other embodiments, the third layer may be disposed directly on the first layer. In some embodiments, nanowires comprise more than three layers.

In embodiments, the LEP is structured to provide a floodlight or spotlight source, generally of infrared light. In other embodiments, the LEP is a programmed, planar signboard wherein individual LEPs or groups of LEPs are separately addressed under program control. The LEP in lower power modes provides a source for photonic instrumentation, especially spectrophotometers. The LEP with emissivity in one or more wavelength bands can be calibrated against a standard and provide a radiation substandard. In embodiments, the LEP provides the radiation source within an infrared communication system. In all embodiments the LEP can be operated in a pulse mode thereby supporting synchronous photonic communications.

BRIEF DESCRIPTION OF THE DRAWINGS

FIG. 1 depicts an LEP comprising a microplatform and nanowires disposed within a cavity.

DETAILED DESCRIPTION

Definitions: The following terms are explicitly defined for use in this disclosure and the appended claims:

"microplatform" means a platform having a maximum dimension of about 100 nanometers on a side up to about 1 centimeter.

"metamaterial (MM) structure" as defined uniquely for this specification means a photonic structure within the microplatform having sub-wavelength dimensions providing an enhancement of electromagnetic emissivity or a reduction in thermal conductivity. The metamaterial structure may be resonant or non-resonant and plasmonic or non-plasmonic.

"metamaterial pixel or MM pixel" in the present invention means a pixel comprising MM structure.

"photonic crystal (PhC)" means an MM structure comprising areas of varying permittivity within the microplatform providing a narrowband filter enhancing emission of infrared within a limited wavelength range.

"surface plasmonic polariton" (SPP) means a surface electromagnetic waveguided-field along a metamaterial-patterned surface having sufficient electrical conductivity to support associated electron motion.

"phononic crystal (PnC)" means a metamaterial (MM) structure comprised of periodic nanostructure that reduces the thermal energy transport of phonons.

"nanowire" means a suspended structure providing support for the microplatform.

"phononic nanowire" means a suspended nanowire comprising phononic scattering and/or phononic resonant structure providing a reduction in thermal conductivity.

"infrared" as defined uniquely for this invention disclosure means electromagnetic radiation within the range of VIS, NIR, SWIR, MWIR, LWIR, and millimeter wavelengths.

emitter" or "IR source" means a source of electromagnetic radiation within the defined infrared spectrum. In this invention the LEP emissivity is primarily within the SWIR and longer wavelengths.

"m, mm, um and pm" respectively means a unit of length as meter, millimeter, micrometer, nanometer and picometer, respectively.

FIGS. 1-5 depict pixels comprised of microplatforms configured as example to provide embodiments of the LEP invention.

Figure 1:
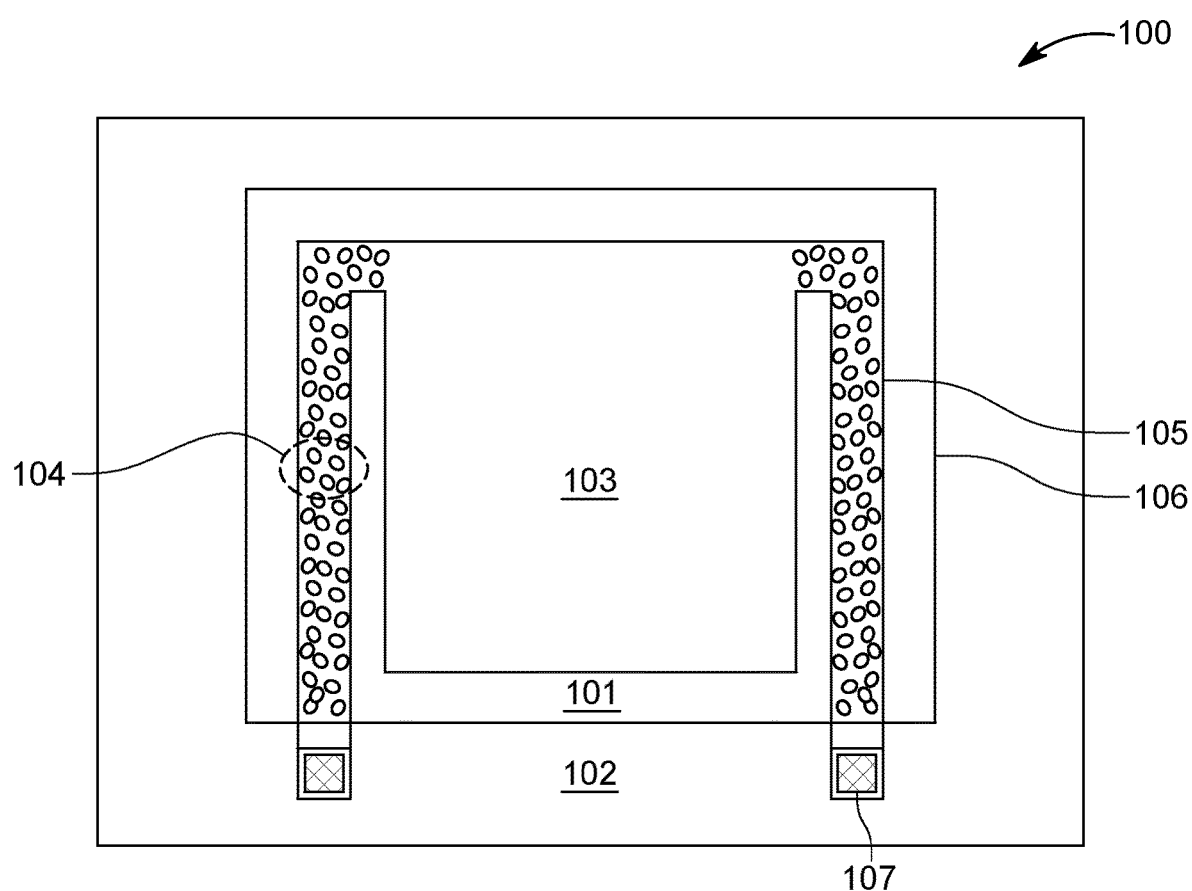
FIG. 1 depicts an LEP

FIG. 1 is a plan view depicting microplatform 103 with nanowires 104, 105, the microplatform 103 supported from a surrounding support platform 102. The microplatform and nanowires are disposed within cavity 106. Each nanowire 104, 105 is attached to the periphery of the microplatform 103. The nanowires 104, 105 are connected further onto the surrounding support platform 102 through pads 107. In embodiments, the microplatform 103 is comprised of at least one thermal resistive element and at least one photonic element. The photonic element can include an LC inductive-capacitive resonator or a micro-antenna (MA) that provides emissivity within a limited infrared wavelength range.

A photonic element enhances and/or filters infrared blackbody radiation from the microplatform 103. The photonic element comprises a material or device of high photonic emissivity within a broad or limited wavelength range. The thermal element comprises an electrical resistive element for heating the microplatform 103 to facilitate blackbody radiation from the microplatform 103.

Figure 2:
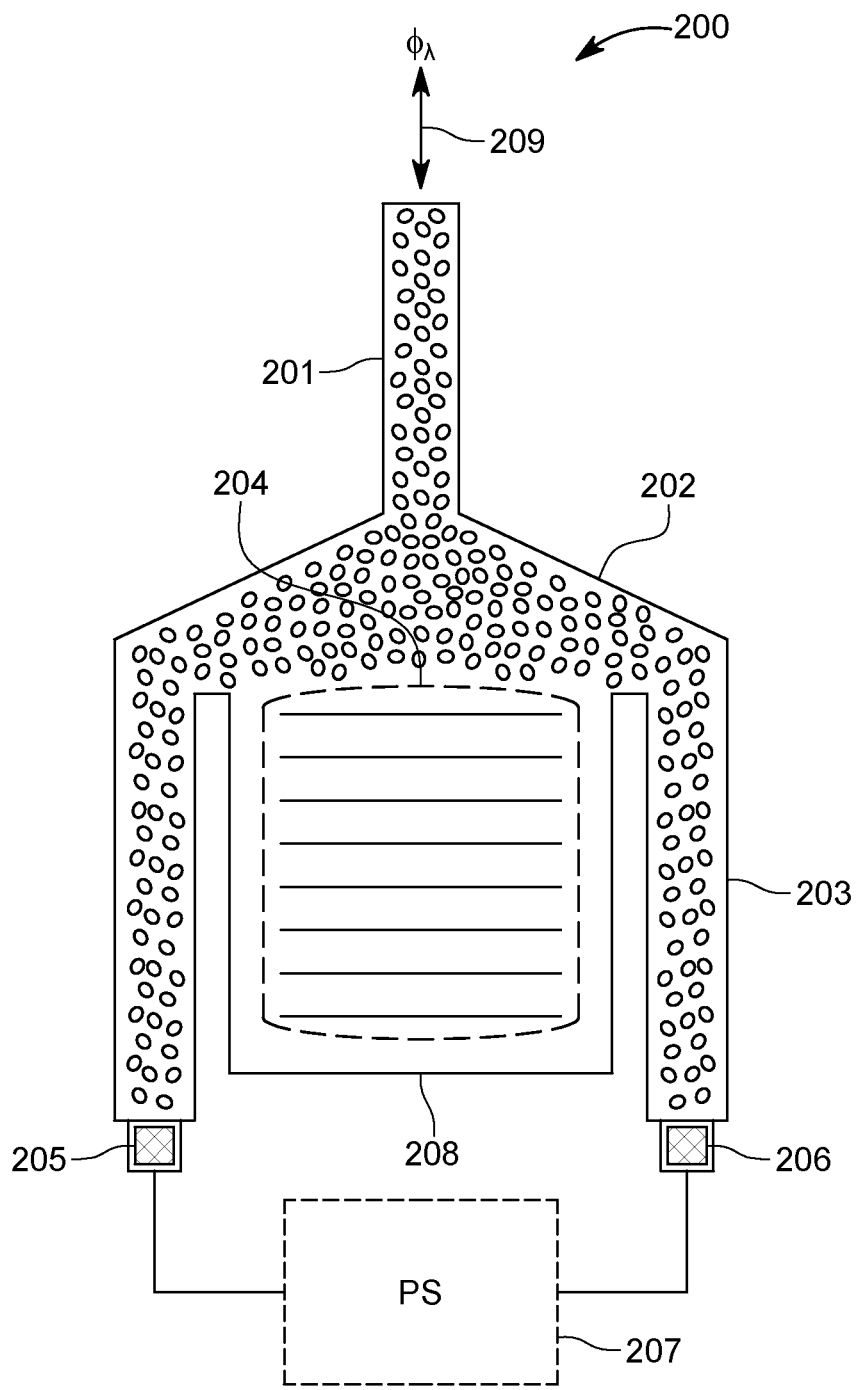
FIG. 2 depicts an LEP with a Bragg filter and emission into a photonic waveguide.

FIG. 2 depicts another embodiment of the LEP. It comprises a Bragg filter 204 suspended with nanowires 203 within a surface cavity. The Bragg filter provides a photonic output signal into photonic waveguide 201 having a reduced bandwidth. The power supply nanowires are anchored onto pads 205, 206 disposed on a surrounding substrate and connected to ail external electric power supply 207. The microplatform is heated from the power supply 207. Infrared radiation created in the heated microplatform propagates laterally through photonic waveguide 201 to provide a source of infrared 209 propagating into an external photonic device structure.

FIG. 2 LEP embodiment 200 is configured with the heated microplatform 208 to provide an infrared source for scientific instrumentation applications that include spectrophotometry. Photonic waveguide 201 is structured as a phononic nanowire 203. Phononic structures/elements 201, 203 reduce the nanowire thermal conductivity by phononic scattering and/or phononic resonance.

Figure 3:
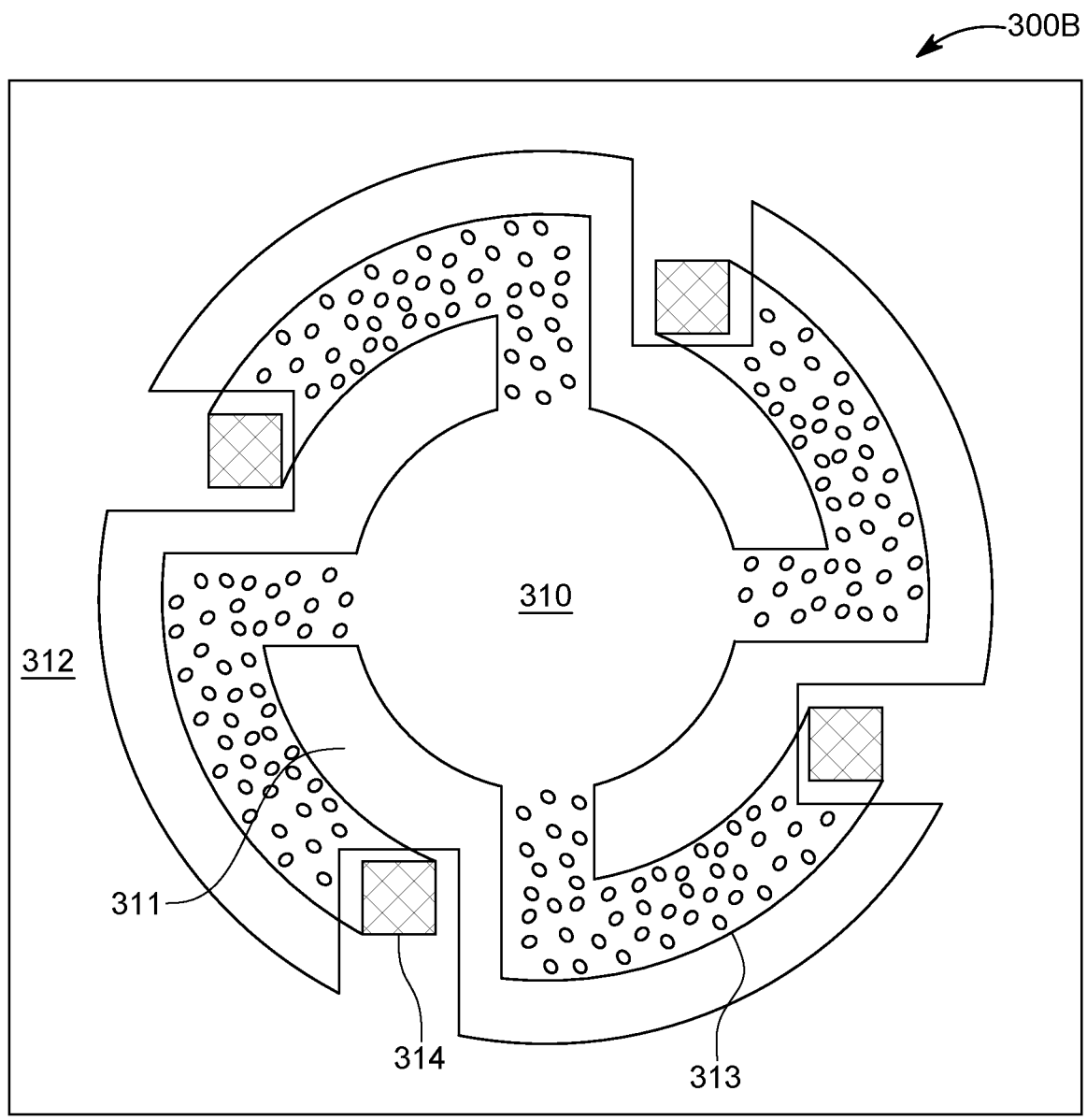
FIG. 3 depicts an LEP with a circular structure for providing thermal stress relief.

FIG. 3 depicts a plan view of an LEP 300B embodiment comprising the microplatform 310 supported by nanowires 313 over cavity 311 suspended from surrounding substrate 312. The nanowires 313 are anchored on pads 314 disposed on the surrounding substrate 312. The circular suspension structure permits the microplatform 310 to rotate with high temperature strain more readily as a portion of the nanowires 313 is heated, thereby reducing overall stress.

Figure 4:
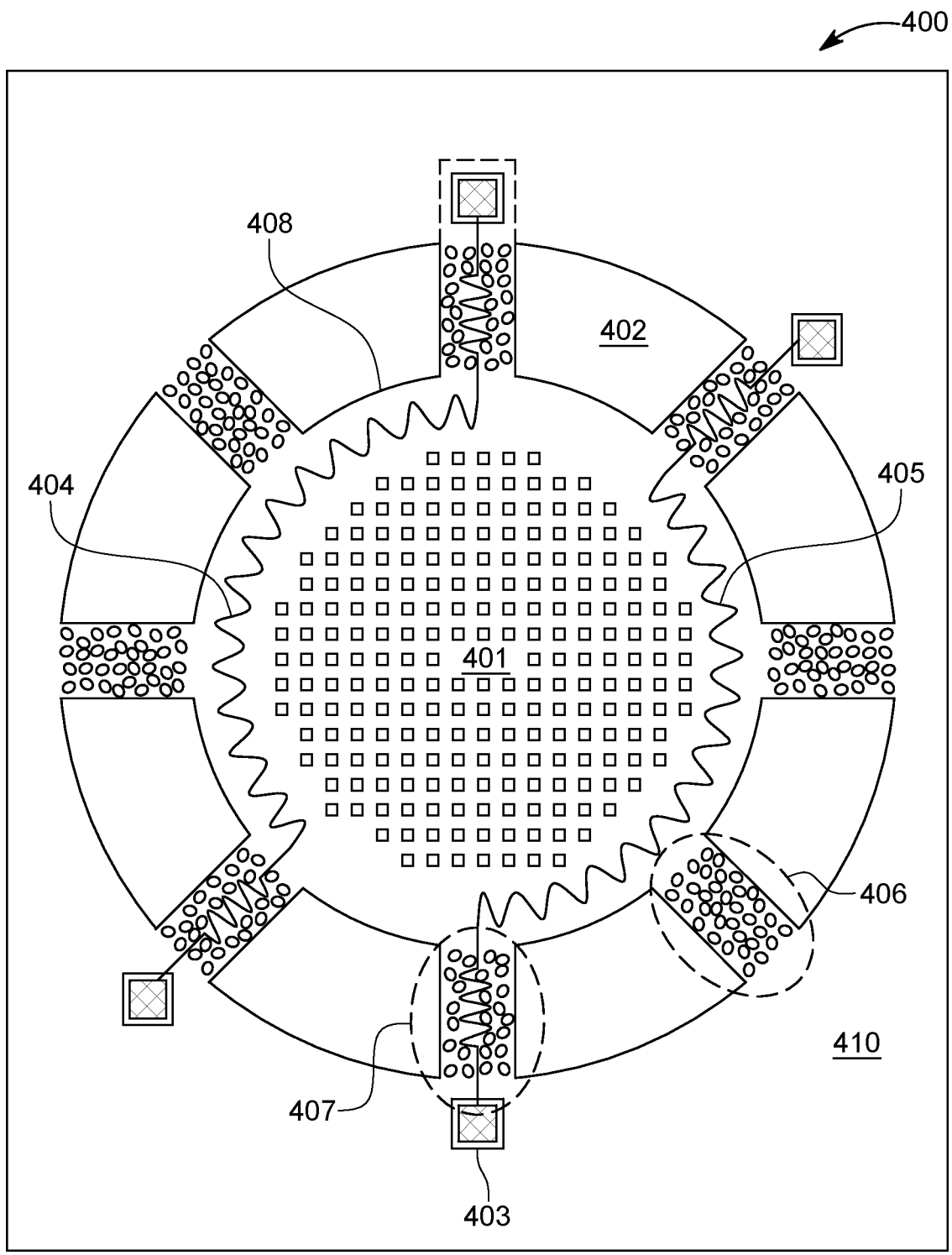
FIG. 4 depicts an LEP with circular structure and a multiple plurality of nanowires.

FIG. 4 depicts an LEP 400 comprised of microplatform 408, supported by nanowires 406, 407 from surrounding substrate 410 within cavity 402. The microplatform 408 comprises resistive heaters 404, 405 connected to external power through nanowires terminating on the surrounding substrate 410. In embodiments, the thermal element comprises resistive heaters 404, 405 heating the microplatform 408 thereby providing a source of infrared radiation.

In embodiments, the structures depicted as 404 and 405 may be patterned into the microplatform 408 as thermoelectric Seebeck or thermistors for sensing the microplatform temperature. In other embodiments, the electrical resistors 404, 405 are powered as heaters to provide a means of outgassing and/or gettering the surface cavity environment. As such, cleaning or gettering functions can be provided as a single pixel within an array of pixels disposed within a single cavity. 402.

Additional tethering nanowires 406 provide rigidity for the microplatform 408. In embodiments, the microplatform 408 comprises metamaterial filters (MM) 401 providing radiation within a limited infrared bandwidth.

Figure 5:
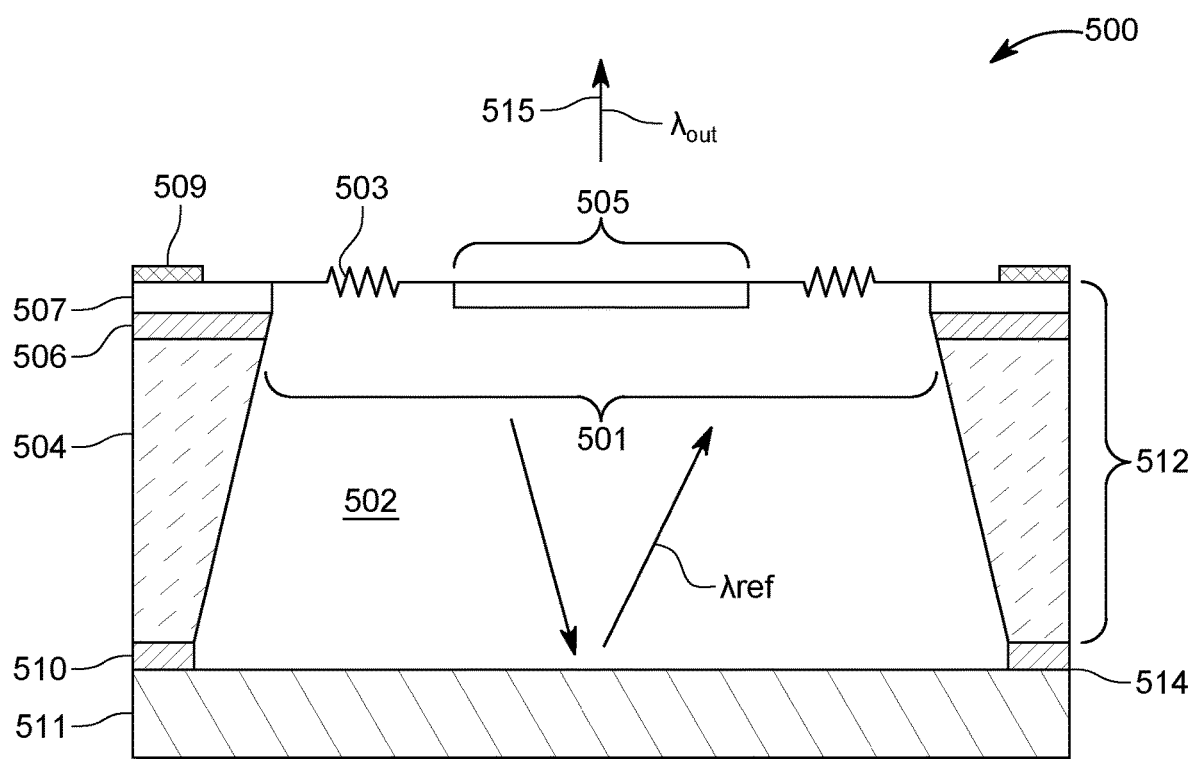
FIG. 5 is a cross-sectional view depicting the LEP with wafer backside etch for application with a mirror.

FIG. 5 is a cross-section view depicting the LEP 500 processed from a starting SOI wafer wherein the microplatform 505 and nanowires 503 are depicted as structure 501 suspended from the surrounding substrate 512 over cavity 502. Nanowires 503 are electrically connected with pads 509. The surrounding substrate 512 comprises a sandwich structure comprised of the active semiconductor layer 507, silicon dioxide (BOX) 506 and handle wafer substrate 504. The microplatform 505 and nanowires 503 are released during wafer processing using a backside anisotropic etch to create cavity 502 within surrounding substrate structure 512. A thin film 510 is used to bond the LED substrate structure 512 to a larger underlying substrate 511 and reflecting thin film 514, substrate 511 generally comprising a printed circuit board. The primary radiation λout 515 from the heated microplatform 505 exits normally upward, and a secondary beam λref radiates from the underside of the microplatform 505. The beam λref is of reduced intensity and is redirected back into the microplatform 505 from the reflecting metal film 514.

Figure 6:
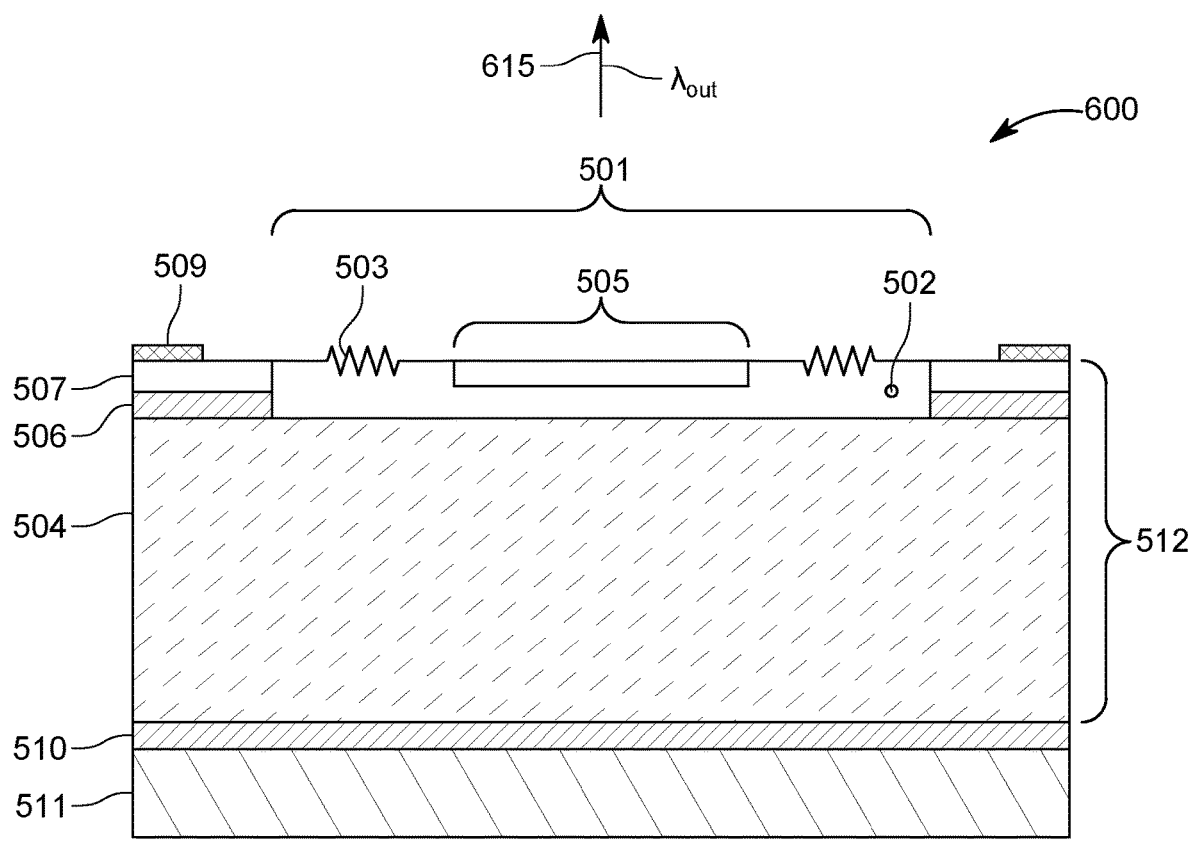
FIG. 6 is a cross-sectional view depicting the LEP without wafer backside etch.

FIG. 6 is a cross-section view depicting the LEP 600 structured similar to the LEP of FIG. 5 and fabricated from a starting silicon SOI wafer, but without removal of any backside silicon from the underlying substrate 504. Infrared radiation λout 615 is upward as with the LEP of FIG. 5. The microplatform 505 is suspended by nanowires 503 within cavity 502, the cavity created into the surface of underlying substrate 504. Nanowires 503 are electrically connected with pads 509. The surrounding substrate 512 comprises a sandwich structure comprised of the active semiconductor layer 507, silicon dioxide (BOX) layer 506 and underlying substrate 504. The LEP structured with the surrounding sandwiched substrate 512 is bonded to an underlying printed circuit board or ceramic header 511 with a thin film of eutectic solder 510. The microplatform 505 of FIG. 6 is depicted without photonic material of high photonic emissivity.

Figure 7:
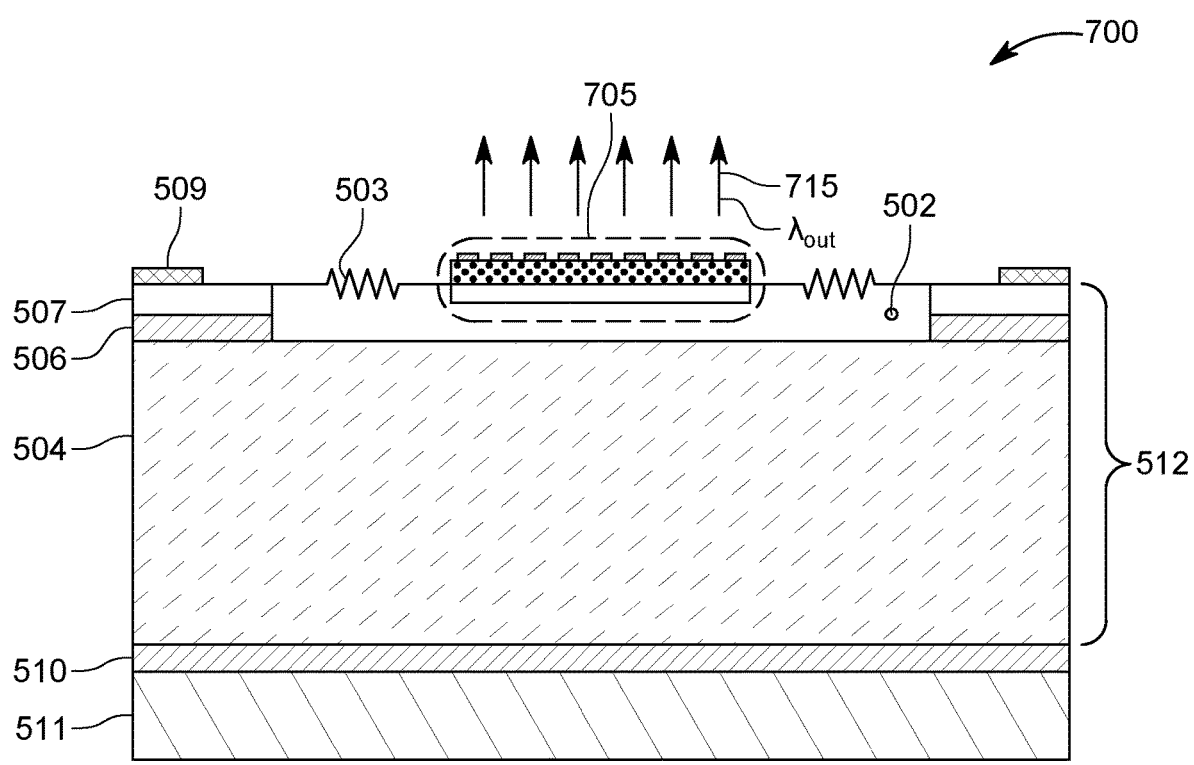
FIG. 7 is a cross-sectional view depicting the LEP with resonant photonic filters disposed on the microplatform.

FIG. 7 is a cross-section view depicting embodiment LEP 700 wherein the microplatform 705 comprises a metamaterial (MM) resonant filter providing infrared radiation over a limited bandwidth. The pixel of FIG. 7 is processed and structured similar to the LEP of FIG. 6 wherein the platform comprises a photonic filter structure for the blackbody radiation. The microplatform 705 is suspended by nanowires 503 within cavity 502 over underlying substrate 504. Nanowires 503 are electrically connected with pads 509. The surrounding substrate 512 comprises a sandwich structure comprised of the active semiconductor layer 507, silicon dioxide (BOX) layer 506 and handle underlying substrate 504. The LEP 700 structured within the surrounding sandwiched substrate 512 is bonded to an underlying printed circuit board of ceramic header 511 with a thin film of eutectic solder 510.

In embodiments, the microplatform 705 of FIG. 7 may also be structured with a surface providing a broadband emissivity such as a field of nanotubes, especially vertically aligned carbon nanotubes. Other surface structures providing high emissivity over a broad infrared bandwidth are graphene, silicon black, gold black, and patterned semiconductor grass.

Figure 8:
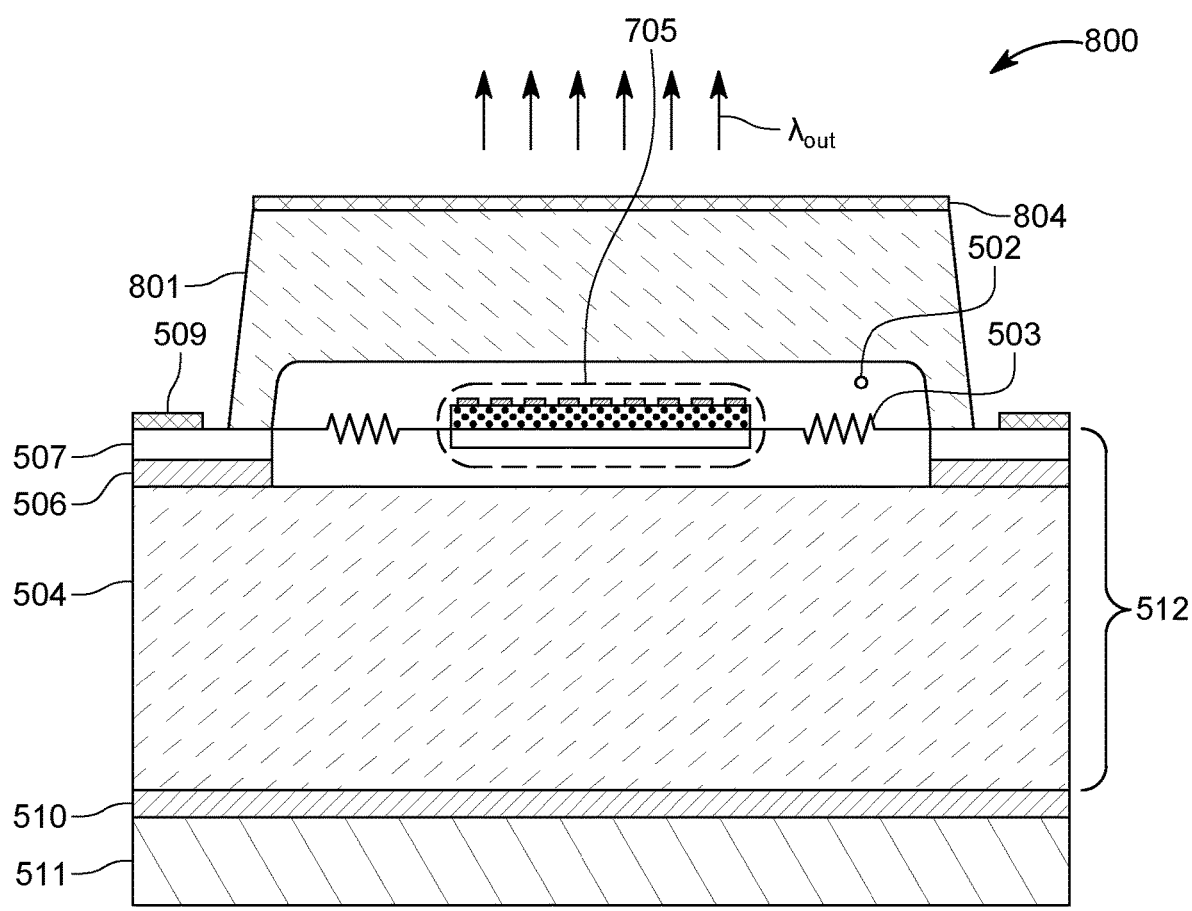
FIG. 8 is a cross-sectional view depicting the LEP with hermetic cavity seal.

FIG. 8 is a cross-section of the LEP 800 of FIG. 7 processed from a starting silicon SOI wafer and with a topside wafer 801 bonded to provide a hermetic seal for the microplatform 705 and nanowires 503 suspended within cavity 502 from surrounding substrate 512. Hermetic cavity 502 is formed by bonding the surrounding substrate 512 onto a second substrate 801 as a post processing step in the LEP fabrication sequence. Microplatform 705 and nanowires 503 are disposed within the hermetic cavity 502. In this embodiment, cavity 502 is maintained in a vacuum condition or filled with a gas of low thermal conductivity. A non-reflective film 804 enhances emitted radiation bout exiting from the LEP 800. Nanowires 503 are electrically connected with pads 509. The surrounding substrate 512 comprises a sandwich structure comprised of the active semiconductor layer 507, silicon dioxide (BOX) layer 506 and underlying substrate 504. The LEP 800 is bonded to a printed circuit board or ceramic header 511 using a thin film of solder 510.

Figure 9A:
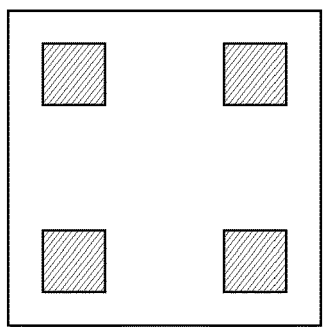
FIG. 9A-9H are topside views depicting a microplatform with several resonant filter types.
Figure 9B:
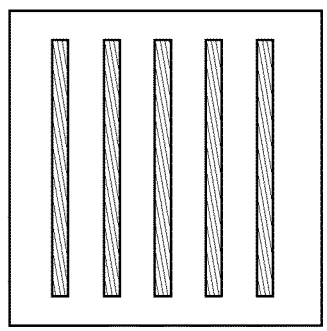
Figure 9C:
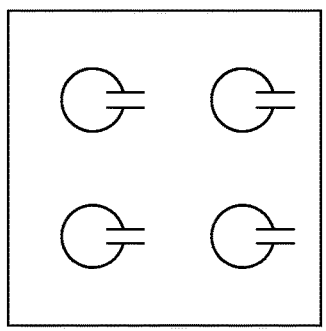
Figure 9D:
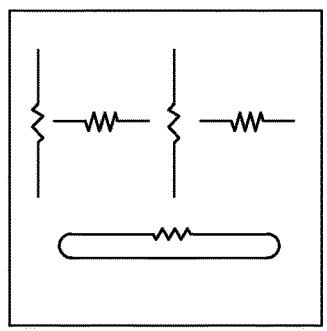
Figure 9E:
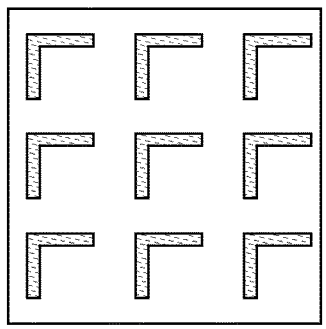
Figure 9F:
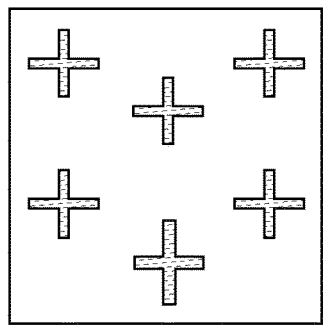
Figure 9G:
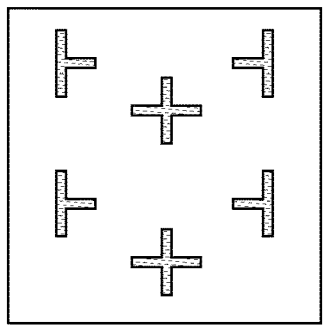
Figure 9H:
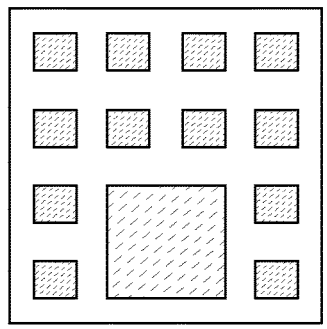
Figure 10A:
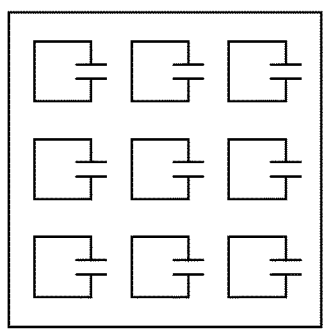
FIG. 10A-10H are topside views depicting a microplatform with several resonant filter types.
Figure 10B:
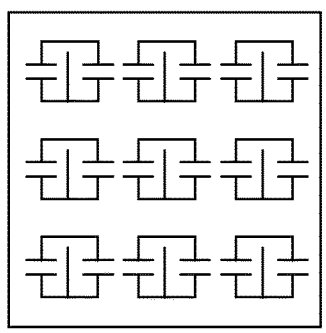
Figure 10C:
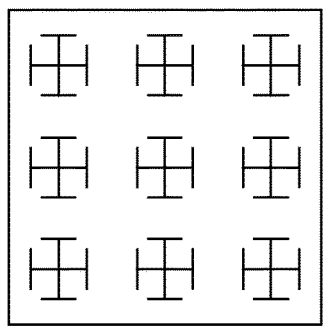
Figure 10D:
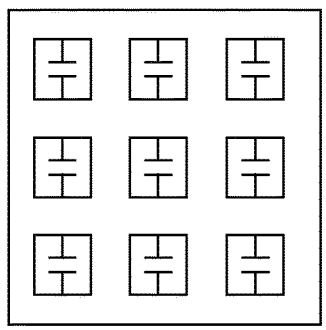
Figure 10E:
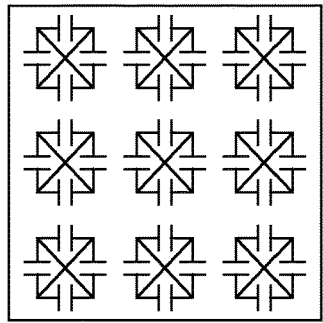
Figure 10F:
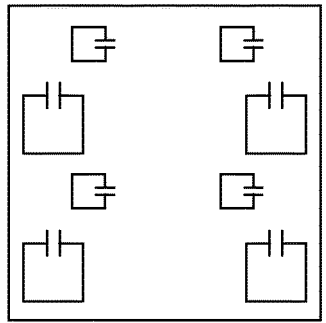
Figure 10G:
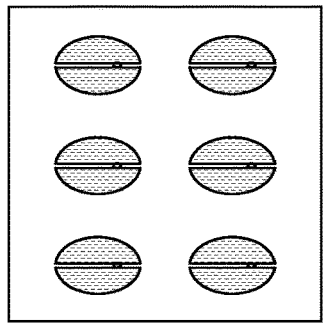
Figure 10H:
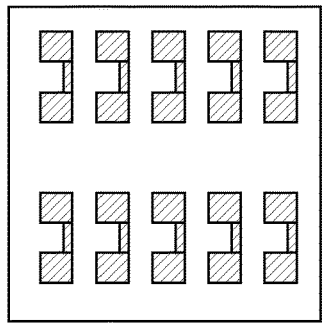

FIGS. 9A-9H depict a topside view of an LEP microplatform 900 comprising patterned resonant photonic elements providing radiation over a limited bandwidth. Arrays of sub-wavelength plasmonic resonators providing a filtering of the black body surface excitation are depicted in examples FIGS. 9A, 9E, 9F, 9G, 9H. Example FIG. 9B detects a 2-D Bragg filter useful for filtering infrared emission out at oblique angles including the plane of the microplatform 900. Filter 9H provides radiation within two wavelength bands wherein the plasmonic structures are resonant at different wavelength bands. Example FIGS. 9C, 9D depict LC inductive-capacitive circuits providing radiation within the band of LC resonance.

FIGS. 10A-10H depict eight additional embodiments comprising filters disposed on a microplatform 1000 emitting within a limited wavelength range. Each of the filters in FIGS. 10A-10H is an LC resonator with the exceptions of filters in FIGS. 10G, 10H wherein the resonance can be plasmonic. Filter FIG. 10F comprises LC resonators providing enhanced infrared radiation within two primary wavelength bands.

Figure 11A:
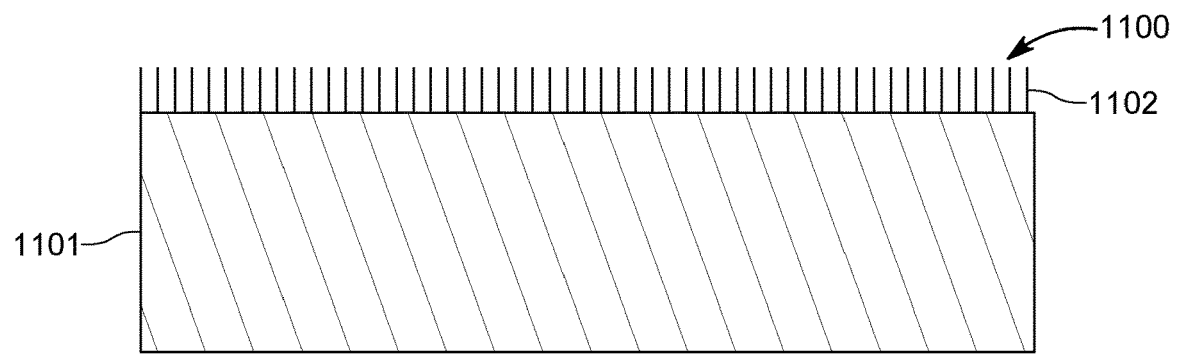
FIGS. 11A-11D are cross-sectional views depicting a microplatform configured with a broadband radiator and 3 narrowband filters.
Figure 11B:
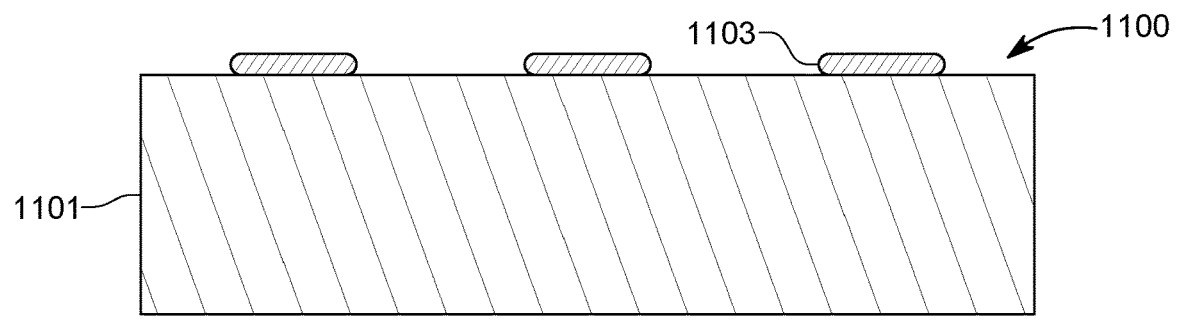
Figure 11C:
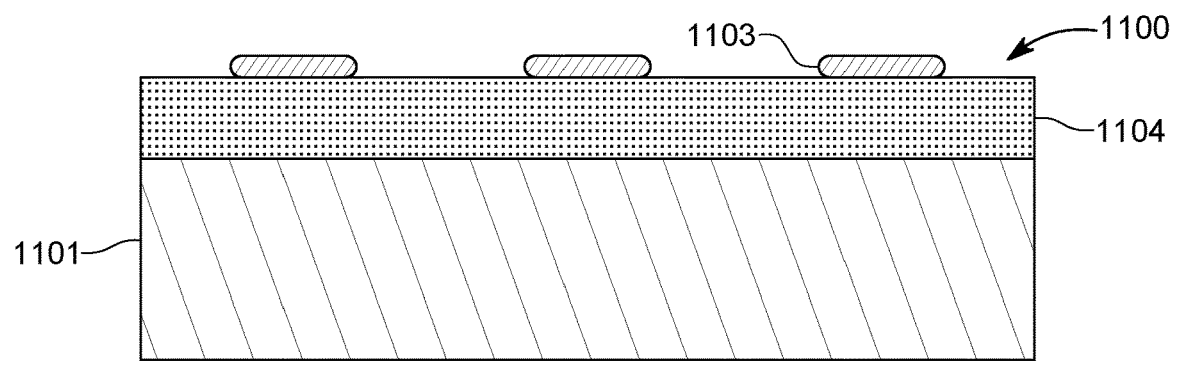
Figure 11D:
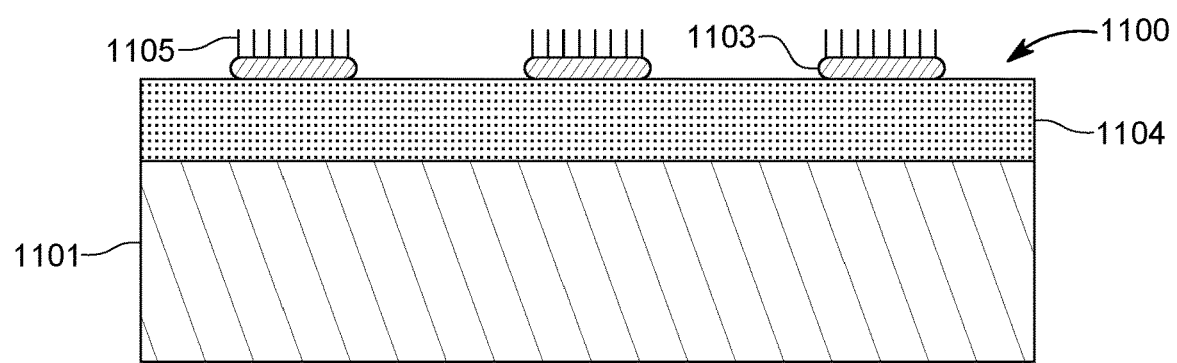

FIGS. 11A-11D depict cross-section views of the microplatform 1100 wherein FIG. 11A comprises a broadband emissive surface and FIGS. 11B, 11C, 11D provide emission within a limited infrared range. The microplatform 1100 of FIG. 11A may comprise fields of nanotubes 1102, especially carbon nanotubes 1102, graphene, TiW thin film, and patterned pillars formed by additive or subtractive patterning over a substrate 1101.

FIG. 11B depicts the microplatform 1100 comprised of the patterned resonant metallic structures 1103 of FIGS. 9 and 10 disposed directly onto the microplatform 1100.

Moreover, FIG. 11B depicts the resonant structures 1103 disposed over the substrate 1101 within the microplatform 1100.

FIG. 11C depicts the microplatform 1100 configured with resonant structures 1103 over a dielectric film 1104 over the substrate 1101.

FIG. 11D depicts the microplatform 1100 with patterned resonant metallic structures 1103 with carbon nanotubes 1105 configured over the reasonant structures 1103 over the dielectric film 1104 over the substrate 1101. As such, there is increased infrared emissivity such as with vertical wall carbon tubes. In embodiments, individual LEP microplatforms provide surface radiation flux density within the range from 1 nanoWatt to over 100 milliWatt.

Figure 12A:
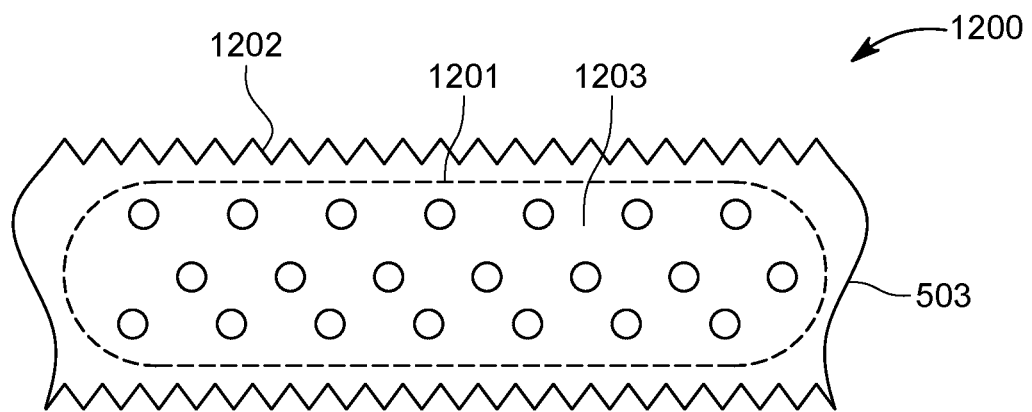
FIGS. 12A-12B are plan views of a nanowire depicting phononic structuring.
Figure 12B:
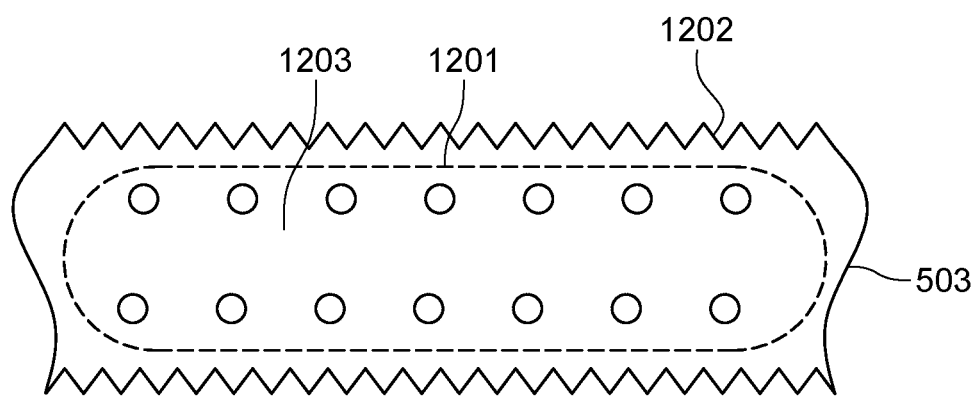

FIGS. 12A, 12B depict plan views of an LEP nanowire first layer 503 comprised of different types phononic structure. The edge structure 1202 is generally random, but in some embodiments it can be periodic and comprise a 1-D phononic crystal. The phononic structure 1201 over the planer area of nanowire 503 is depicted as random in FIG. 12A. In embodiment FIG. 12B, the phononic structure is an array with structural periodicity comprising a phononic crystal (PnC) 1203. The PnC is further characterized by a phononic bandgap wherein phonons with a certain frequency range are restricted in movement.

Figure 13A:
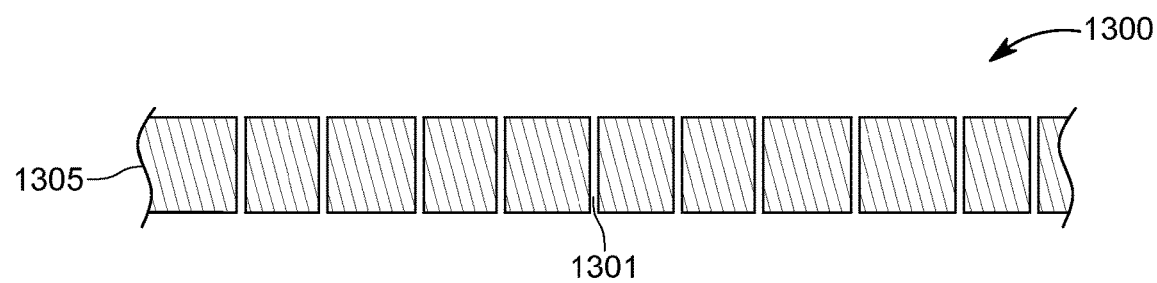
FIGS. 13A-13C are the cross-sectional views depicting the phononic nanowire first layer with ALD second and third layer embodiments.
Figure 13B:
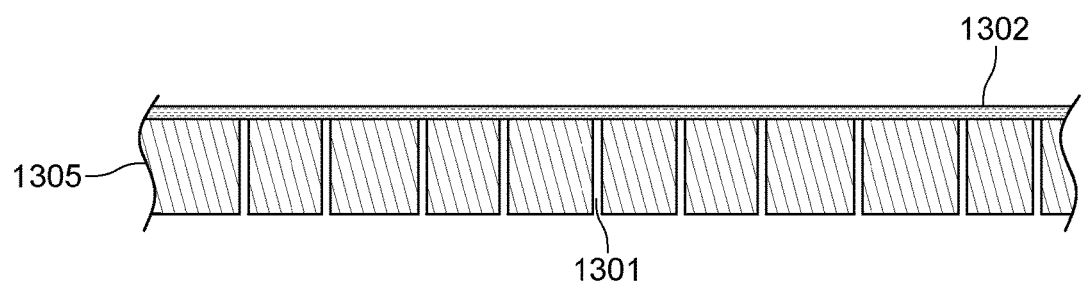
Figure 13C:
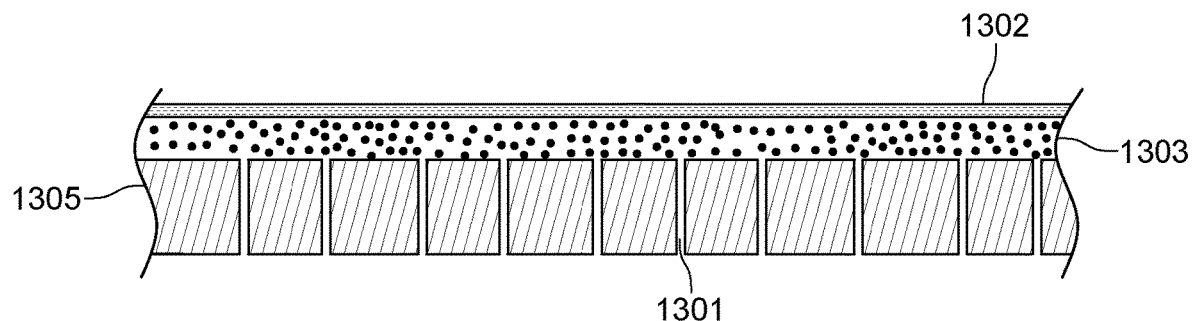

FIGS. 13A-13C depict cross-sectional views of the nanowire first layer 1305 comprising a phononic crystal PnC holey structure. The PnC structure is depicted as 1301 wherein the holes are disposed periodically in the crystalline semiconductor first layer. In the embodiment 13B, an ALD metallic surface film 1302 is deposited over the PnC 1301 of the first layer for the purpose of increasing the electrical conductivity of the nanowire 1300. In embodiment FIG. 13C, the nanowire 1300 is structured with an additional ALD film 1303 of dielectric material providing electrical isolation between the ALD metallic film 1302 and the semiconductor layer 1305. The phononic structure within the first layer of nanowires may comprise holes, vias, surface pillars, surface dots, plugs, cavities, local particulates, implanted molecular species, and molecular aggregates disposed randomly or in periodic fashion.

Figure 14:
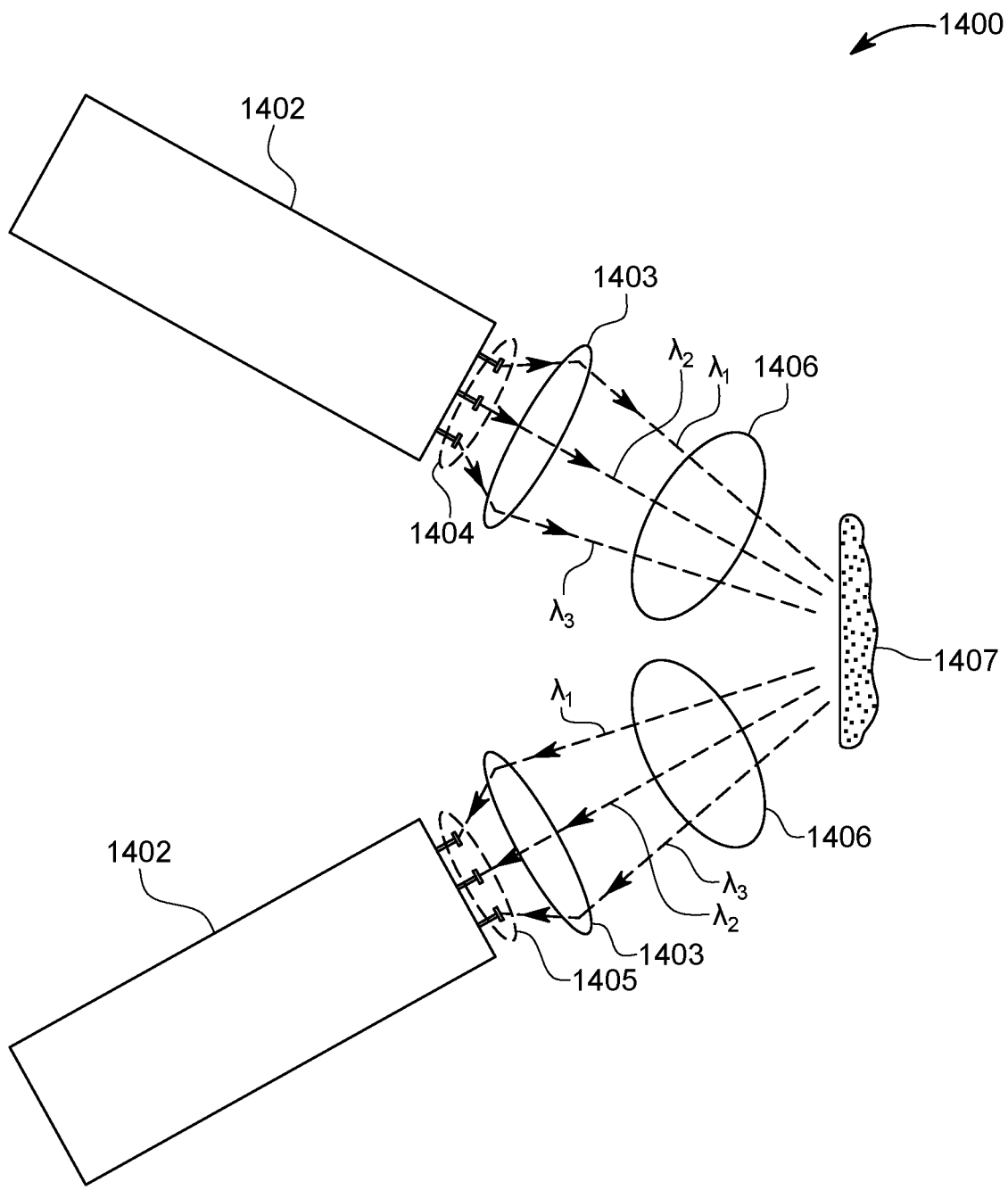
FIG. 14 is a schematic illustration of the LEP depicted providing the light source within a spectrophotometer application having a reflected beam path.

FIG. 14 depicts the LEP 1400 disposed within a spectrophotometer instrument 1400 wherein LEP source 1404 with control circuit 1402 provides infrared beams $\lambda 1$, $\lambda 2$, $\lambda 3$ 1406. In this embodiment comprising multiple radiating pixels, the three infrared beams 1406 radiating in three different wavelength bands are focused through lens 1403 onto a remote surface of interest 1407 and reflected on into the spectrophotometer detector. The detector is comprised of infrared sensors 1405 and control circuit 1402.

Figure 15:
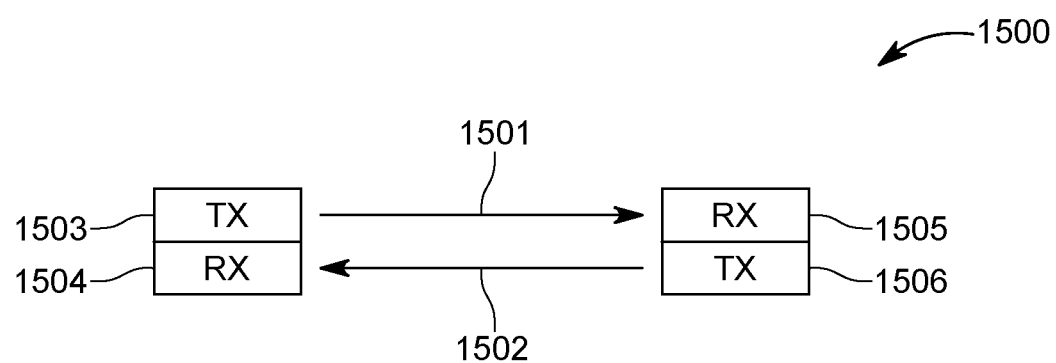
FIG. 15 is a schematic illustration with the LEP depicted providing the modulated light source TX within a photonic communication system.

FIG. 15 depicts the LEP operational within a full duplex infrared communication system 1500. The LEP TX 1503 sources forward signal 1501 into remote receiver RX 1506. At the remote location, LEP TX 1506 sources reply signal 1502 into local receiver RX 1504. The maximum data rate for communication is generally limited by the thermal time constant of the LEP. The LEP thermal time constant is proportional to the mass of the microplatform and inversely proportional to the effective thermal conductivity within the pixel which cools the microplatform.

Figure 16:
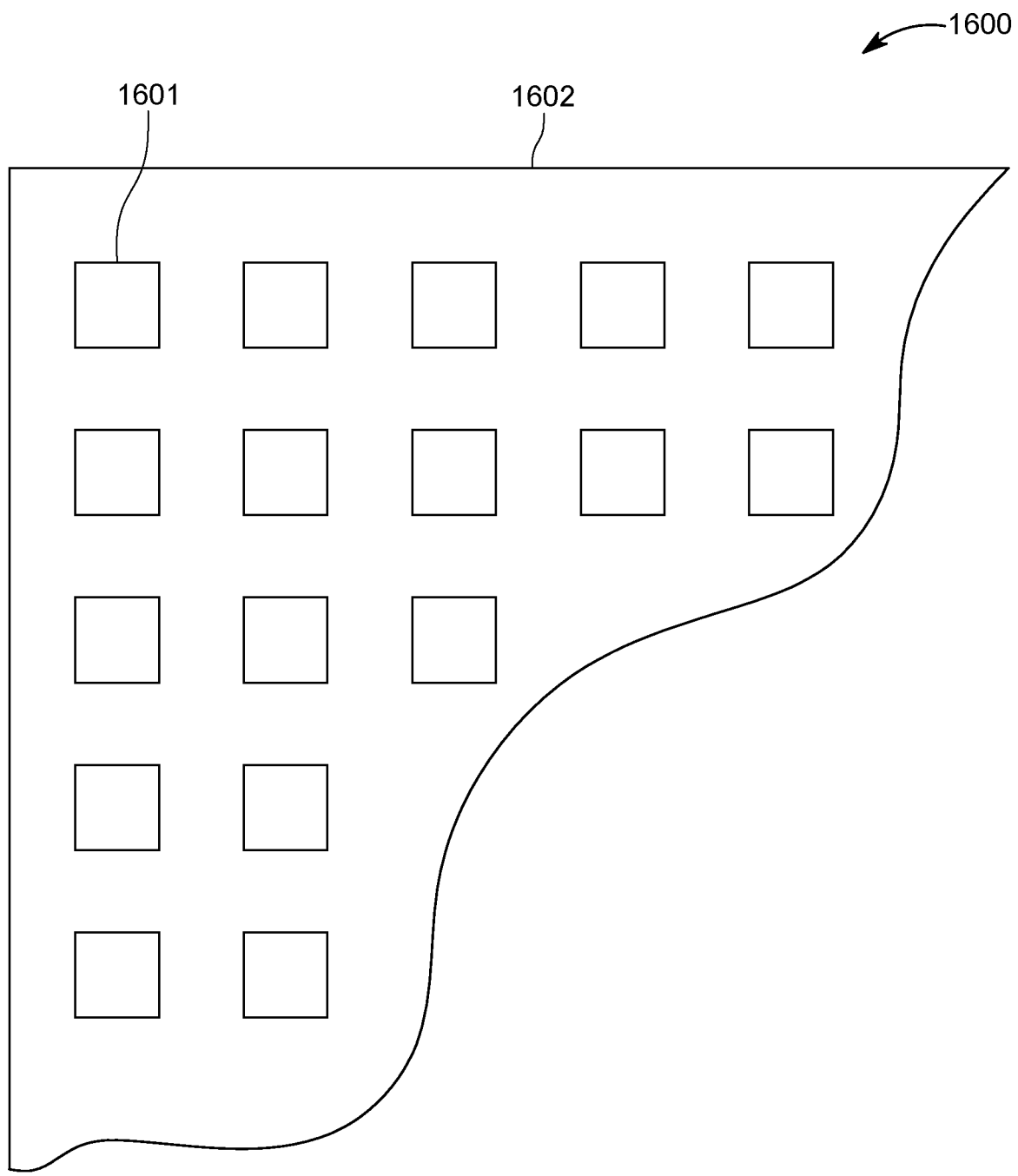
FIG. 16 is a top view depicting the LEP disposed in an arrayed format.

FIG. 16 is a plan view 1600 depicting the LEP 1601 disposed in array format on a semiconductor chip 1602. In embodiments the LEPs disposed in array format can cover an entire semiconductor wafer. In embodiments designed with silicon SOI starting wafers, an array of pixels comprising up to several million, when powered simultaneously, are configured to provide over 100 watts of high efficiency infrared power from a 100 mm diameter wafer.

Figure 17:
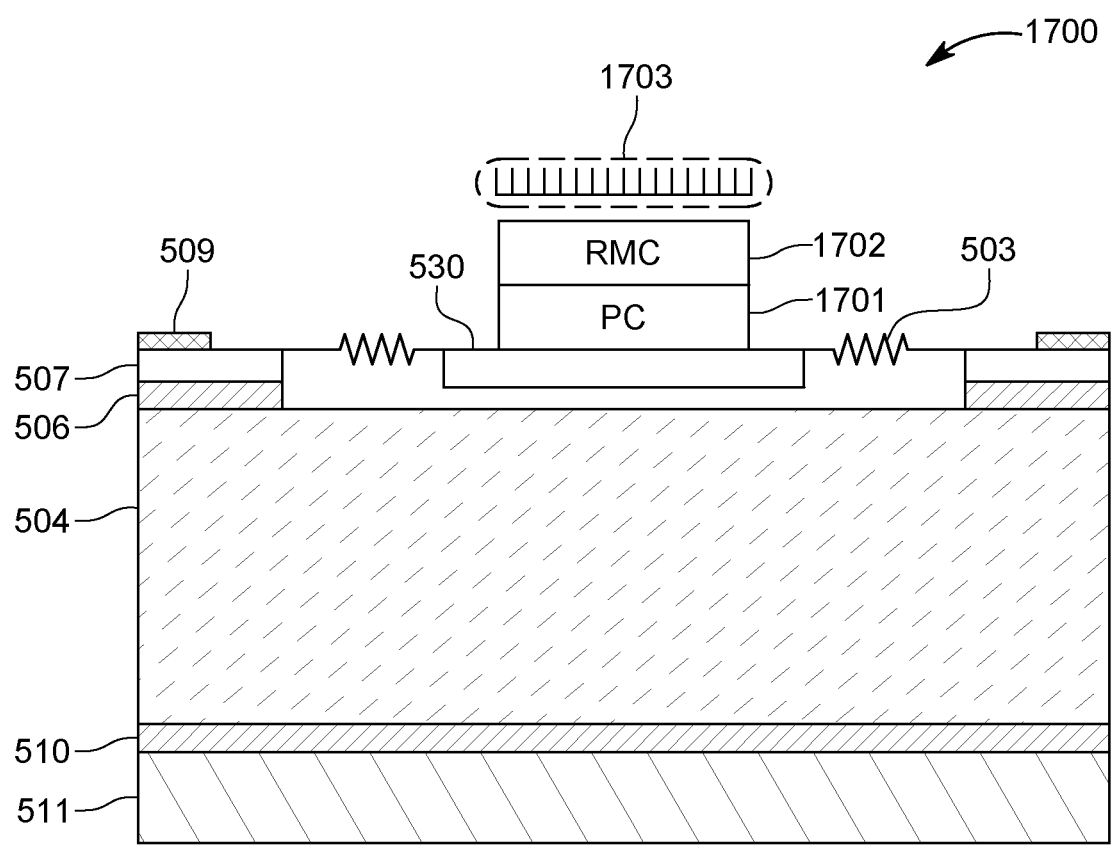
FIG. 17 is a topside view depicting the pixel having a micro-platform comprising a photonic crystal (PC) and a distributed Bragg reflector micro-cavity.

FIG. 17 depicts an LEP 1700, wherein the photonic element comprises photonic crystal (PCP 1701 that is electromagnetically coupled with a Bragg micro-cavity. The pixel provides a radiation intensity of limited bandwidth within an infrared wavelength range. The emitted intensity substantially exceeds the well-known Planckian blackbody exitance limit within said limited wavelength range. In this embodiment of the invention, the microplatform comprises a 1-D, 2-D, or 3-D photonic crystal (PC) having metal elements providing localized plasmonic resonances coupled to nonlinear oscillators within a resonant micro-cavity (RMC) 1702.

In FIG. 17, in this embodiment, the active layer of semiconductor 530 in a starting wafer provides the heater, with the heater thermally isolated by nanowires 1701. One preferred embodiment the photonic element comprises the PC 1701 and RMC 1702 created by additive processing on a starting microplatform comprised of the active layer of a starting silicon SOI wafer. Moreover, 503, 504, 506, 507, 509, 510, and 511 are substantially similar to what is recited in the description for the previous figures.

In FIG. 17, the photonic crystal (PC) 1701 comprises one or more layers of metallic wires structured as a metamaterial providing a resonance at a selected infrared wavelength, thereby driving a resulting non-linear oscillator to create non-linear Bloch waves. The metallic PC with is phononically-enhanced plasmonic (PEP) resonances create slow-light wavelength bands which couple readily into the resonant micro-cavity (RMC) 1702 comprised of metallic metamaterial. The phonically driven photonic element provides a non-equilibrium infrared excitation resulting in a super-Planckian thermal radiation from the heated microplatform. The resulting super-Planckian thermal emission from the photonic element is within a narrow band of resonance.

In FIG. 17, the photonic emission surface of the photonic element is enhanced by a field of material 1703 having a high infrared emissivity such as vertical wall carbon nanotubes (VWCNT). The VWCNT field is typically grown by a CVD process from a precursor such as $H_2C_2$. The nanotubes typically are grown onto an ALD anchor-film comprised of a titanium compound such as TIN. In addition, an example of super-Planckian infrared emission is disclosed by S-Y Lin et al, "An In-situ and direct confirmation of super-Planckian thermal radiation emitted from a metallic photonic crystal at optical wavelengths", Scientific Reports, vol 10, 5209 (2020), doi: 10.1038/s41598-020-62063-2.

In other embodiments, individual LEP microplatforms within an array are addressed separately or in groups of microplatforms. An application where microplatforms are addressed separately is the programmable infrared signboard. The individual LEP microplatforms are physically configured as individual pixels or groups of pixels and are addressable to provide an active and programmable infrared signboard.

In embodiments, an array of LEDs comprising microplatforms emitting at multiple wavelengths are addressed as individual platforms or groups of platforms through external multiplexing circuitry. Such multiplexing is used in the spectrophotometer application wherein discrete, programmable wavelengths are multiplexed.

In some embodiments, the bandwidth for operation can be significantly reduced by designing structures for Fano resonance which is typically of high-Q. This resonance can be obtained with plasmonic nanostructures of several types including plasmonic holey or particle arrays and Bragg diffraction gratings.

In embodiments, the microplatform and nanowires are comprised of silicon carbide or gallium nitride semiconductor films providing structural rigidity at temperatures of over 1500° C. Dielectric passivation films disposed on the microplatform typically comprise one or more of silicon nitride, aluminum oxide, silicon dioxide and hafnium oxide.

Metal films are typically deposited prior to lithographic patterning with a DC magnetron tool. Dielectric films are generally deposited by RF sputtering. Patterning of these thin films is accomplished using a resist such as patterned PMMA with a lift-off process.

In embodiments, the microplatform is formed of a semiconductor wafer having a resistivity as high as 1000 Ohm-cm and the heater element in the microplatform is defined by a patterned diffusion. It is desirable to form the nanowire first layer from a semiconductor of minimum resistivity. If the starting wafer is a silicon SOI wafer, the active layer is generally of resistivity higher than 1 Ohm-cm and the maximum conductivity desirable in the nanowire first layer is obtained by patterned solid state diffusion. The desirable minimum resistivity in the first layer of silicon can be as low as 0.002 Ohm-cm at room temperature.

In embodiments, the pixel or group of pixels are hermetically sealed within an environment comprising a gas of low thermal conductivity such as Xe, Kr or Ar. This reduces the parasitic loss due to thermal conductivity of atmosphere between the microplatform and the surrounding environment. In other embodiments, the pixel is hermetically sealed within a vacuum package to increase thermal isolation of the microplatform from the surrounding substrates. In some embodiments, the pixel microplatform comprises a gettering material such as Bi or Ti which when heated can increase the vacuum level within the cavity.

The LEP is configured as an electromagnetic emitter and driven by infrared emission from a heated, high emissivity microplatform surface. The LEP comprises a microplatform suspended with semiconductor nanowires from a surrounding support platform. In embodiments, the defined first layer of nanowires comprises phononic crystal (PnC) providing a decrease in thermal conductivity. In embodiments, the pixel is structured to provide emission within a broad bandwidth or a limited bandwidth. Broadband emission is provided with emissive surface structure such as carbon nanotubes having a very high infrared emissivity. Emission over a limited bandwidth is obtained using metamaterial filters. In embodiments, the internal radiation efficiency of the LEP can exceed 90%. The LEP can also provide an infrared floodlight or collimated beam spotlight.

It is to be understood that the disclosure teaches just some examples of embodiments in accordance with the present invention and that many variations of the invention can easily be devised by those skilled in the art after reading this disclosure and that the scope of the present invention is to be determined by the following claims.

What is claimed is:

1. A light emitting platform (LEP) comprising:
   a first substrate having a cavity;
   a plurality of nanowires, wherein the nanowires are physically coupled to a microplatform and the first substrate, the nanowires thereby suspending the microplatform in the cavity; wherein the microplatform comprises:
   (h) a thermal element and a photonic element;
   (i) the photonic element comprises a material or device of increased emissivity for light within a wavelength range;
   (j) the thermal element comprises an electric resistive element for heating the microplatform;
   (k) at least one of the nanowires comprises a phononic element;
   (l) the phononic element includes a crystalline semiconductor first layer comprising structure that reduces a thermal conductivity of the first layer;
   (m) the phononic element increases a ratio of electrical conductivity to thermal conductivity of the nanowire; and
   the LEP is physically configured for application as a photonic thermal emitter.

2. The LEP of claim 1 disposed in one or more positions on the first substrate with or without addressing other individual LEPs or other groups of LEPs.

3. The LEP of claim 2 configured to provide an infrared floodlight or collimated beam spotlight.

4. The LEP of claim 2 configured wherein individual pixels or groups of pixels are addressable to provide an active infrared signboard.

5. The LEP of claim 2 configured with the microplatform heated to provide an infrared source for scientific instrumentation applications including spectrophotometry.

6. The LEP of claim 2 configured for operation within an infrared communication system.

7. The LEP of claim 1 wherein the thermal element comprises a thermistor or Seebeck thermoelectric junction for sensing temperature of the microplatform.

8. The LEP of claim 1 wherein the thermal element comprises an electrical resistive heater for gettering the cavity, thereby providing a cleaning function within the cavity.

9. The LEP of claim 1 wherein the photonic element comprises a material or device of increased emissivity or absorptivity further comprising one or more of nanotubes, graphene, silicon black, gold black, and patterned semiconductor grass providing emissivity within a broadband infrared wavelength range.

10. The LEP of claim 1 wherein the photonic element comprises an LC inductive-capacitive resonator or a microantenna (MA) providing emissivity within a limited infrared wavelength range.

11. The LEP of claim 1 wherein the photonic element comprises a metamaterial device further comprised of, without limitation, a split ring resonator (SRR), plasmonic patch resonator or Bragg grating (BG) providing emissivity within a limited infrared wavelength range.

12. The LEP of claim 1 wherein the crystalline first layer comprises phononic resonant and/or phononic non-resonant scattering sites, further wherein scattering sites are separated by less than the mean free path of heat conducting phonons.

13. The LEP of claim 1 wherein the crystalline first layer comprises phononic crystal (PhC) with structural components disposed in a periodic array, the PhC characterized by a phononic bandgap.

14. The LEP of claim 1 wherein the crystalline first layer comprises structure increasing nanowire surface roughness, the roughness increasing scattering of heat conducting phonons.

15. The LEP of claim 1 wherein the crystalline first layer comprises one or more of holes, vias, surface pillars, surface dots, plugs, cavities, local particulates, implanted molecular species and molecular aggregates disposed randomly or in periodic fashion.

16. The LEP of claim 1 wherein the semiconductor first layer comprises, without limitation, one or more of semiconductors Si, Ge, GaN, SiC and ZnO2.

17. The LEP of claim 1 wherein the nanowire comprising the nanowire comprising the crystalline first layer is further comprised of an atomic layer deposition (ALD) metal second layer providing an increase in nanowire electrical conductivity.

18. The LEP of claim 1 wherein the nanowire comprising the crystalline first layer is further comprised of an atomic layer deposition (ALD) dielectric third layer controlling mechanical stress and/or providing electrical isolation.

19. The LEP of claim 1 wherein the cavity is a hermetic cavity formed by bonding a second substrate onto the first substrate thereby enclosing the platform and nanowires within said cavity.

20. The LEP of claim 1, wherein the cavity is maintained in a vacuum condition or filled with a gas of decreased thermal conductivity.

21. The LEP of claim 1, wherein the photonic element comprises a photonic crystal (PC) having phononically-enhanced plasmonic elements coupling into a resonant micro-cavity (RMC) providing infrared emission within a limited wavelength range.

* * * * *